United States Patent
Yu et al.

(10) Patent No.: US 7,211,845 B1
(45) Date of Patent: May 1, 2007

(54) MULTIPLE DOPED CHANNEL IN A MULTIPLE DOPED GATE JUNCTION FIELD EFFECT TRANSISTOR

(75) Inventors: Ho-Yuan Yu, Saratoga, CA (US); Jian Li, Sunnyvale, CA (US)

(73) Assignee: Qspeed Semiconductor, Inc., Santa Clara, CA (US)

(*) Notice: Subject to any disclaimer, the term of this patent is extended or adjusted under 35 U.S.C. 154(b) by 0 days.

(21) Appl. No.: 11/110,507

(22) Filed: Apr. 19, 2005

Related U.S. Application Data

(60) Provisional application No. 60/563,596, filed on Apr. 19, 2004.

(51) Int. Cl.
  *H01L 29/80* (2006.01)
(52) U.S. Cl. .................. 257/263; 257/264; 257/285
(58) Field of Classification Search ............. 257/263, 257/264, 266, 329, 285–287
  See application file for complete search history.

(56) References Cited

U.S. PATENT DOCUMENTS

| 5,714,777 A * | 2/1998 | Ismail et al. ............... 257/263 |
| 6,777,722 B1 * | 8/2004 | Yu et al. ..................... 257/134 |
| 2005/0029557 A1 * | 2/2005 | Hatakeyama et al. ....... 257/263 |

* cited by examiner

*Primary Examiner*—Mark V. Prenty
(74) *Attorney, Agent, or Firm*—Morgan, Lewis & Bockius LLP

(57) ABSTRACT

A multiple doped channel in a multiple doped gate junction field effect transistor. In accordance with a first embodiment of the present invention, a junction field effect transistor (JFET) circuit structure comprises a vertical channel. The vertical channel comprises multiple doping regions. The vertical channel may comprise a first region for enhancement mode operation and a second region for depletion mode operation.

19 Claims, 4 Drawing Sheets

MULTIPLE DOPED CHANNEL IN A MULTIPLE DOPED GATE JUNCTION FIELD EFFECT TRANSISTOR

RELATED APPLICATIONS

This application claims priority to U.S. Provisional Patent Application Ser. No. 60/563,596, filed Apr. 19, 2004, entitled "Device Structures of Normally On and Normally Off JFETs with Multiple Doped Gate and Multiple Conduction Channel Doping" to Yu, which is hereby incorporated herein by reference in its entirety.

Commonly owned U.S. Pat. No. 6,251,716, entitled "JFET Structure and Manufacture Method for Low On-Resistance and Low Voltage Application" to Yu, is hereby incorporated herein by reference in its entirety.

Commonly owned U.S. Pat. No. 6,307,223, entitled "Complementary Junction Field Effect Transistors" to Yu, is hereby incorporated herein by reference in its entirety.

Commonly owned U.S. Pat. No. 6,355,513, entitled "Asymmetric Depletion Region for Normally Off JFET" to Yu, is hereby incorporated herein by reference in its entirety.

Commonly owned U.S. Pat. No. 6,486,011, entitled "JFET Structure and Manufacture Method for Low On-Resistance and Low Voltage Application" to Yu, is hereby incorporated herein by reference in its entirety.

FIELD OF THE INVENTION

Embodiments in accordance with the present invention relate generally to the structure and fabrication process for manufacturing junction field effect transistors (JFET). More particularly, this invention relates to a novel device structure and fabrication process for manufacturing a multiple doped channel in a multiple doped gate junction field effect transistor.

BACKGROUND

Junction field effect transistor structures, for example, as described in U.S. Pat. No. 6,251,716, U.S. Pat. No. 6,307,223, U.S. Pat. No. 6,255,513, and U.S. Pat. No. 6,486,011, have advantages over bipolar transistors. These advantages include lower on-resistance, lower noise margin, higher ESD protection and faster switching speed.

SUMMARY OF THE INVENTION

However, it is desirable to improve such junction field effect transistor structures in order to further decrease on resistance, decrease gate capacitance and to stabilize threshold voltage with respect to temperature and voltage.

Accordingly, a multiple doped channel in a multiple doped gate junction field effect transistor is disclosed. In accordance with a first embodiment of the present invention, a junction field effect transistor (JFET) circuit structure comprises a vertical channel. The vertical channel comprises multiple doping regions.

In accordance with another embodiment of the present invention, the vertical channel comprises a first region for enhancement mode operation and a second region for depletion mode operation.

In accordance with yet another embodiment of the present invention, a junction field effect transistor (JFET) circuit structure comprises a vertical channel and a trench, having an inner wall adjacent to a portion of the vertical channel. The JFET further comprises a gate structure disposed substantially adjacent to a bottom wall of the trench and comprising multiple doping regions. A doping region of the gate structure may be fully depleted.

In accordance with still another embodiment of the present invention, a junction field effect transistor (JFET) circuit structure comprises a vertical channel comprising multiple doping regions and a trench, having an inner wall adjacent to a portion of the vertical channel. The JFET further comprises a gate structure disposed substantially adjacent to a bottom wall of the trench and comprising multiple doping regions.

DETAILED DESCRIPTION OF THE INVENTION

In the following detailed description of the present invention, multiple doped channel in a multiple doped gate junction field effect transistor, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Embodiments in accordance with the present invention are described in the context of design and operation of integrated semiconductors. More particularly, embodiments of the present invention relate to a multiple doped channel in a multiple doped gate junction field effect transistor. It is appreciated, however, that elements of the present invention may be utilized in other areas of semiconductor design and operation.

The following description of embodiments in accordance with the present invention is directed toward n channel devices constructed in n-type bulk or n-type epitaxial material. It is to be appreciated, however, that embodiments in accordance with the present invention are equally applicable to p channel devices constructed in p-type bulk or p-type epitaxial material. Consequently, embodiments in accordance with the present invention are well suited to semiconductors formed in both p-type and n-type materials, and such embodiments are considered within the scope of the present invention.

It is to be appreciated that embodiments in accordance with the present invention are well suited to use in other semiconductor materials, for example, in compound semiconductors such as gallium arsenide, GaAs, silicon germanium, SiGe, silicon carbide and the like.

Figure 1:
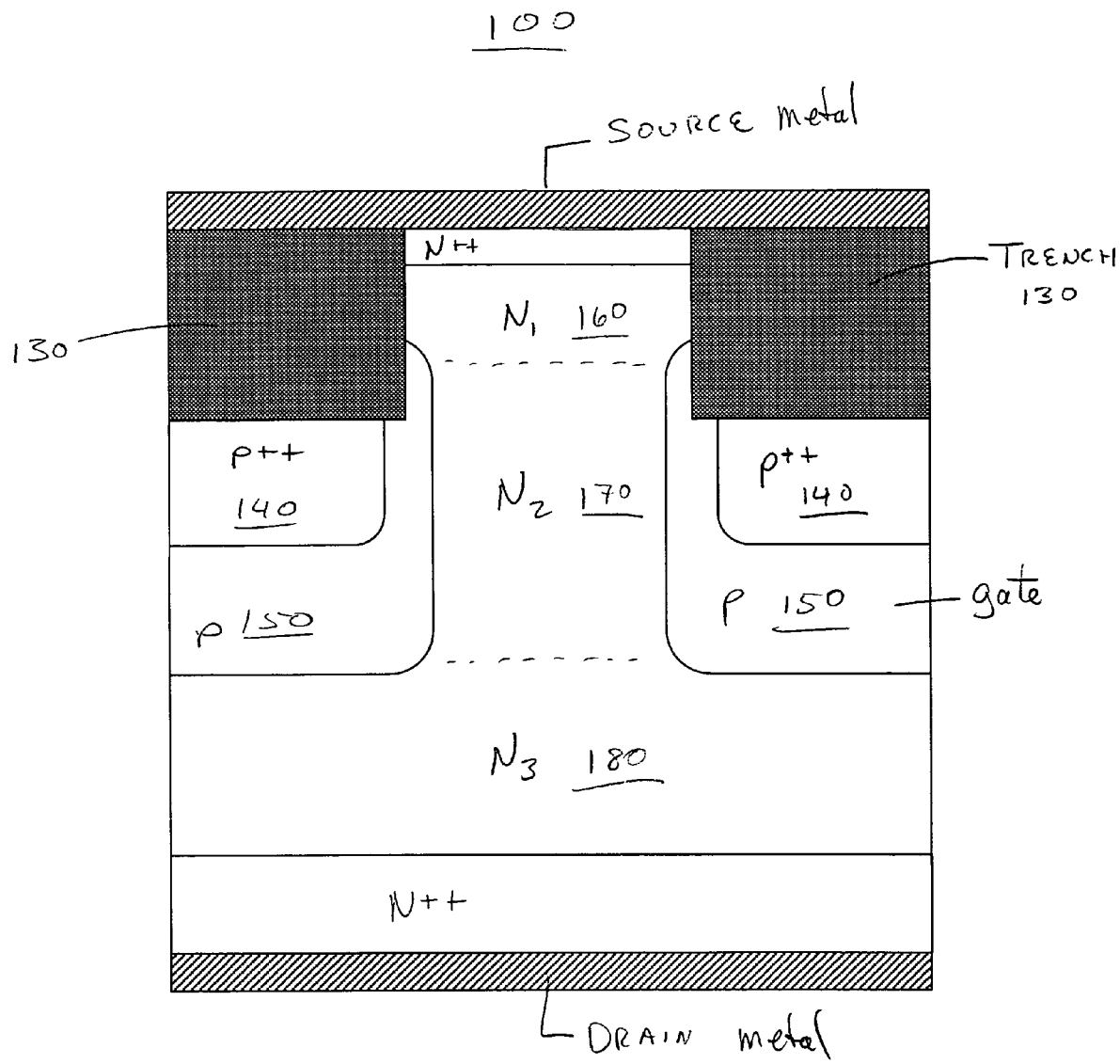
FIG. 1 illustrates a novel trench junction field effect transistor structure having multiple different doping concentration regions in the channel, in accordance with embodiments of the present invention.

FIG. 1 illustrates a novel trench junction field effect transistor structure 100, in accordance with embodiments of the present invention. Transistor structure 100 is shown at an exaggerated view so as to better illustrate embodiments of in accordance with present invention. It is appreciated that no scale or size relationship among features is expressed or implied based on the dimensions of the Figures.

Transistor structure 100 comprises trench structures 130. Trench structures 130 are formed via well known methods and filled with well known non-conductive material(s), e.g., oxide, nitride or any other suitable material. A gate structure 150, comprising p doping, e.g., from about $1.0E14$ cm$^{-3}$ to about $5.0E17$ cm$^{-3}$, in one example, is formed by well known techniques, for example, implantation, ion implantation with rapid thermal processing (RTP), furnace drive in or furnace doping sources and the like.

Gate structure 150 comprises a highly doped p++ gate subregion 140. Subregion 140 is highly doped, e.g., from about $5.0E17$ cm$^{-3}$ to greater than $1.0E20$ cm$^{-3}$, in one example. The implant energy for the multiple doped gate can be varied depending upon the requirements of the gate junction depth.

Gate subregion 140 serves to reduce the gate resistance by providing a highly conductive region adjacent to the non-conductive trench 130. Gate subregion 140 further improves the integrity of the gate structure and increases the built-in potential of the gate structure.

In accordance with embodiments of the present invention, p gate region 150 can be operated in a fully depleted condition. The combination of p gate region 150 and p++ gate subregion 140 advantageously reduce gate to drain capacitance (Cgd) and also desirably reduce drain to source On resistance (Rds$_{on}$).

Transistor structure 100 further comprises a novel multiple doped vertical channel region comprising channel portions N1 160, N2 170 and N3 180, for instance. The doping concentration of channel portions N1 160, N2 170 and/or N3 180 can be varied either by implant, single or multiple doping process(es) and/or the use of one or multiple epitaxial layers depending on the desired characteristics of the transistor. For example, the doping concentration of channel portions N1 160, N2 170 and/or N3 180 can be varied from less than $1.0E14$ cm$^{-3}$ to over $1.0E17$ cm$^{-3}$.

It is to be appreciated that the concentration of channel portion N2 170 can be higher or lower than either channel portions N1 160 or N3 180. In general, the doping concentrations of channel portions N1 160 or N3 180 will be similar, but the doping concentrations of channel portions N1 160 and N3 180 are not required to be the same or similar, in accordance with embodiments of the present invention. For example, the doping concentrations of each channel portion N1 160, N2 170 and N3 180 can be different. In addition, any of channel portions N1 160, N2 170 and N3 180 can be operated either in enhancement mode or in depletion mode.

For example, typically for a conventional enhancement mode junction field effect transistor (JFET), threshold voltage deleteriously decreases with increasing junction temperature. By varying doping levels of channel portions N1 160, N2 170 and N3 180 such that a channel portion between N1 160 and N2 170 operates in enhancement mode, and a channel portion between N2 170 and N3 180 operates in depletion mode, transistor structure 100 as a whole will behave as an enhancement mode device. In contrast to conventional JFETs, however, the threshold voltage of such a configuration will advantageously remain substantially constant across a large range of junction temperatures and voltages. For example, the threshold voltage of such a configuration may be substantially constant from 0° C. to 150° C. and from 0 volts to over about 600 volts.

Alternatively, doping levels of channel portions N1 160, N2 170 and N3 180 can be varied such that a channel portion between N1 160 and N2 170 operates in depletion mode, and a channel portion between N2 170 and N3 180 operates in enhancement mode. When the roles of source and drain are reversed, such a configuration is well suited to enhancement mode operation for low voltage applications, e.g., to about 30 volts.

Figure 2:
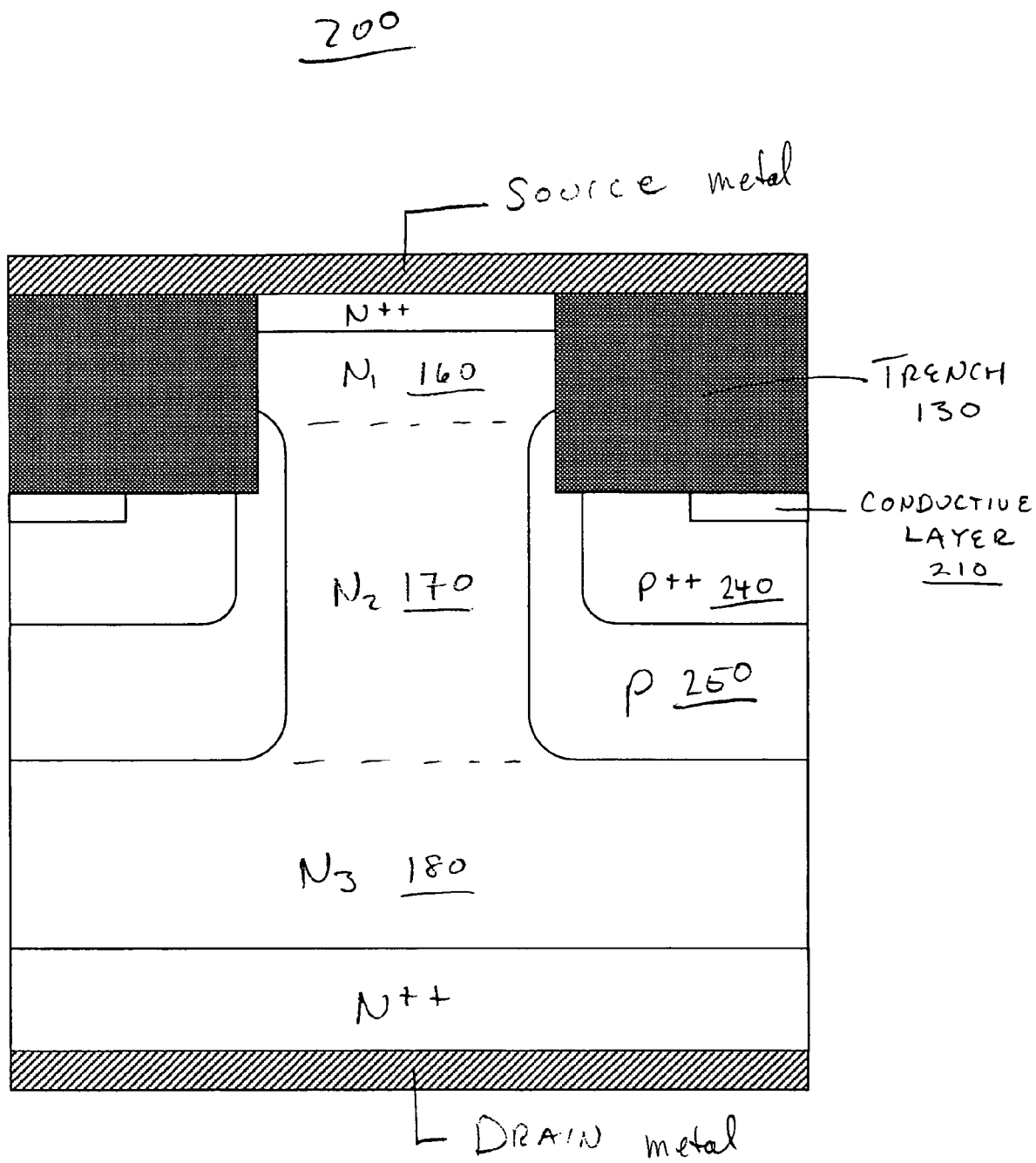
FIG. 2 illustrates another novel trench junction field effect transistor structure having a conduction layer within a gate region, in accordance with embodiments of the present invention.

FIG. 2 illustrates a novel trench junction field effect transistor structure 200, in accordance with embodiments of the present invention. Most structures of junction field effect transistor structure 200 are similar to those of junction field effect transistor structure 100, as described in FIG. 1.

In the example of FIG. 2, junction field effect transistor structure 200 comprises a conductive layer 210 within gate 250 and gate subregion 240. Gate 250 and gate subregion 240 are substantially similar to gate 150 and gate subregion 140 (FIG. 1) in terms of doping levels. The primary difference between gate 250, gate subregion 240 and gate 150, gate subregion 140 (FIG. 1) is in the accommodation of conductive layer 210.

Conductive layer 210 can be formed from any suitable conductive material, e.g., silicide, salicide, metal, doped semiconductor and/or doped polysilicon. It is appreciated that conductive layer 210 does not fully separate gate subregion 240 from trench 130. Conductive layer 210 provides a conductive path adjacent to trench 130 and reduces the overall resistance of gate structure 150. Conductive layer 210 also tends to favor gate current flow toward the "upper" portions of the channel region, e.g., more toward channel portion N1 160 than toward channel portion N3 180.

Figure 3:
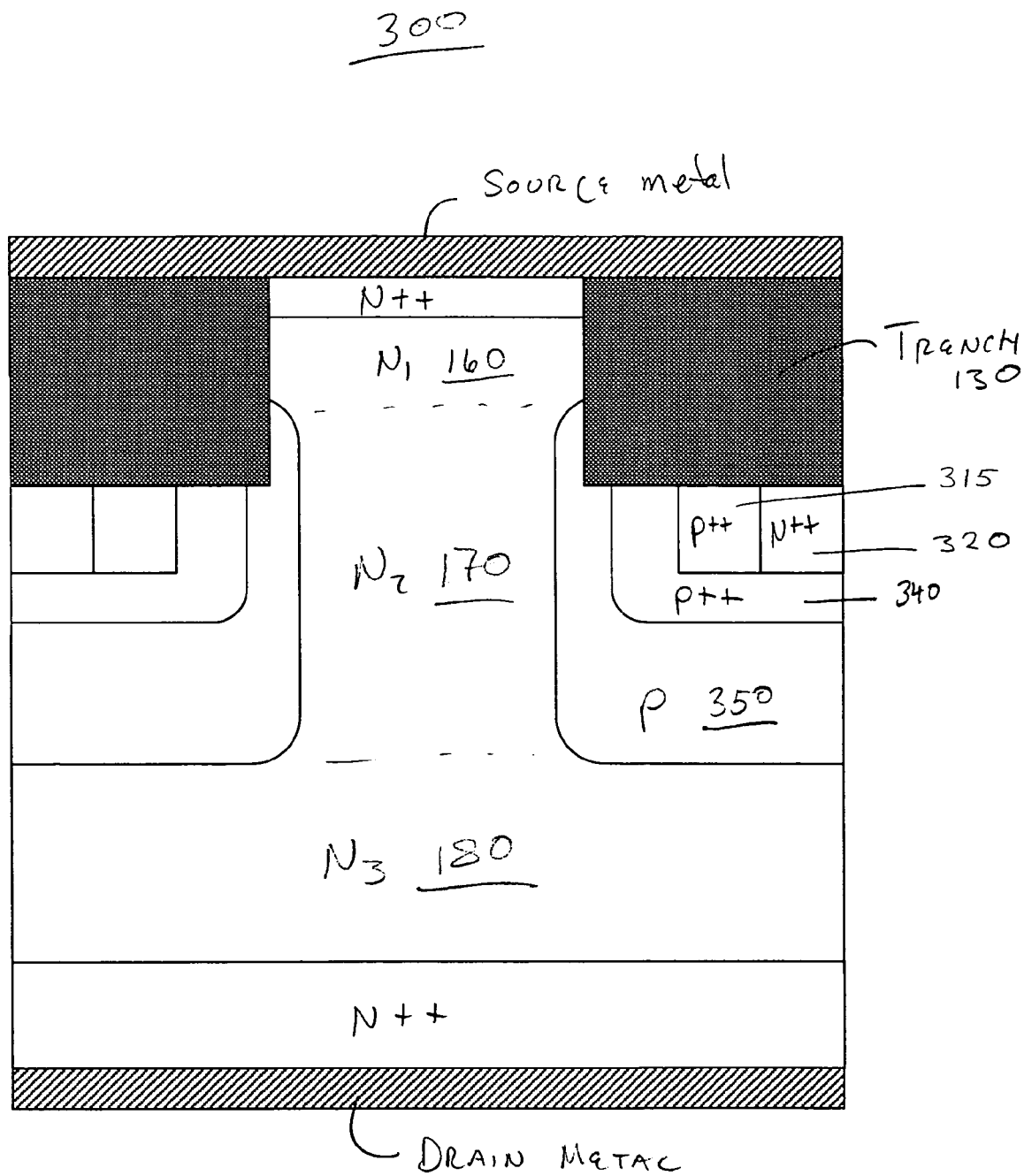
FIG. 3 illustrates still another novel trench junction field effect transistor structure having heavily doped gate regions, in accordance with embodiments of the present invention.

FIG. 3 illustrates a novel trench junction field effect transistor structure 300, in accordance with embodiments of the present invention. Most structures of junction field effect transistor structure 300 are similar to those of junction field effect transistor structure 100, as described in FIG. 1.

In the example of FIG. 3, junction field effect transistor structure 300 comprises gate 350 and gate subregion 340. Gate 350 and gate subregion 340 are substantially similar to gate 150 and gate subregion 140 (FIG. 1) in terms of doping levels. The primary difference between gate 350, gate subregion 340 and gate 150, gate subregion 140 (FIG. 1) is in the accommodation of gate subregion 315 and region 320.

Junction field effect transistor structure 300 also comprises gate subregion 315 and region 320. Region 320 is heavily doped n++, e.g., from about $5.0E17$ cm$^{-3}$ to greater than $1.0E20$ cm$^{-3}$. The region 320 is located adjacent to trench 130 and adjacent to the edge of junction field effect transistor structure 300. Region 320 causes a beneficial reduction in gate current, e.g., by blocking a portion of gate subregion 340 and gate 350 from a source contact (not shown).

Gate subregion 315 will generally have a different doping level than that of gate subregion 340. However, the range of doping for gate subregion 315 is similar to the range of doing for gate subregion 340. For example, gate subregion 315 is highly doped p++, e.g., from about $5.0E17$ cm$^{-3}$ to greater than $1.0E20$ cm$^{-3}$, in one embodiment. Gate subregion 315 enables the overall structure, gate 350, gate subregion 340, gate subregion 315 and region 320, to maintain a low gate resistance. Further, gate subregion 315 serves to direct current toward the channel region.

Figure 4:
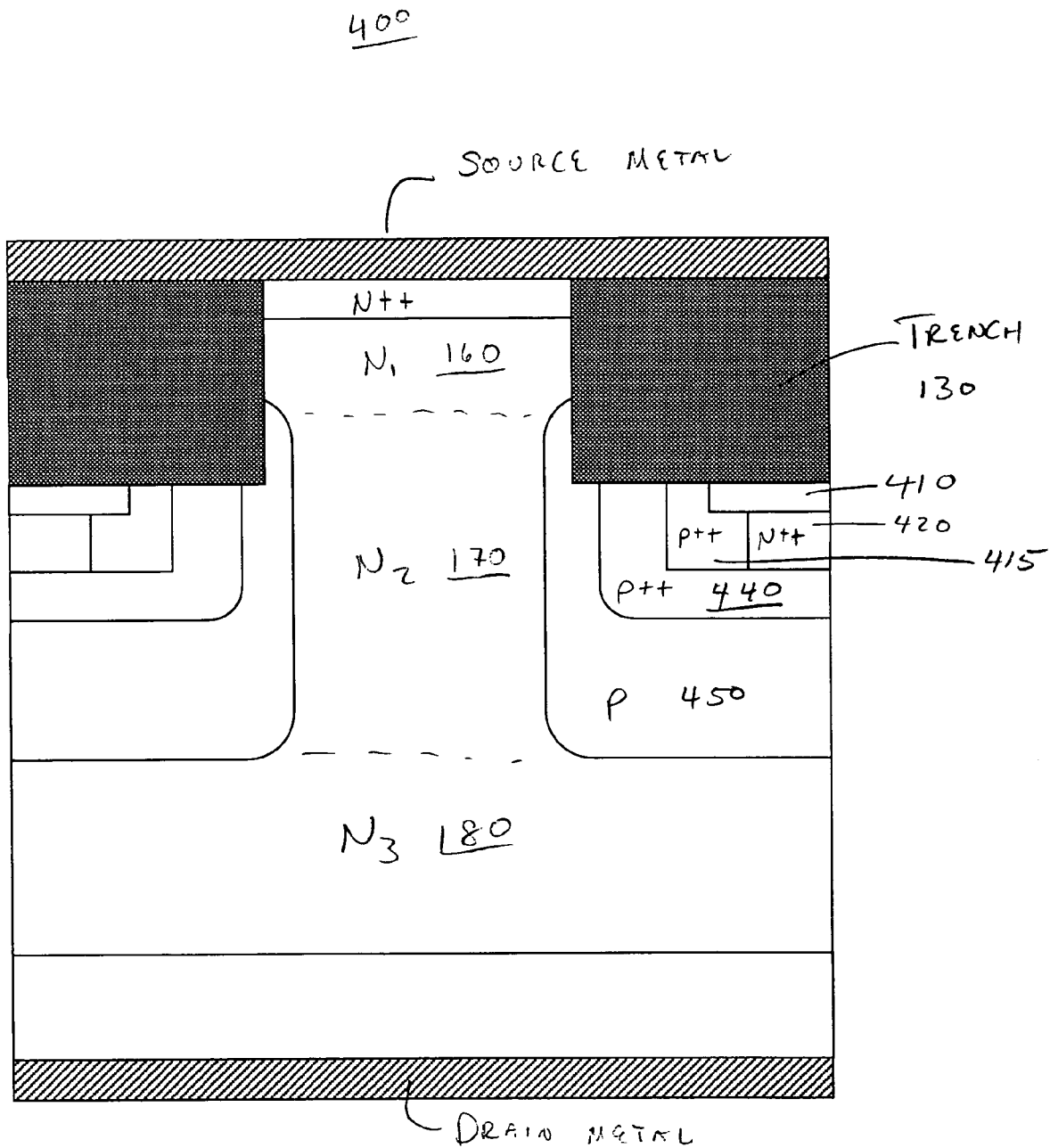
FIG. 4 illustrates still yet another novel trench junction field effect transistor structure having a conduction layer and heavily doped regions of a gate, in accordance with embodiments of the present invention.

FIG. 4 illustrates a novel trench junction field effect transistor structure 400, in accordance with embodiments of the present invention. Most structures of junction field effect transistor structure 400 are similar to those of junction field effect transistor structures 100–300, as described in FIGS. 1–3.

In the example of FIG. 4, junction field effect transistor structure 400 comprises a conductive layer 410, gate subregion 415, region 420, gate subregion 440 and gate 450.

Conductive layer 410 can be formed from any suitable conductive material, e.g., silicide, salicide, metal, doped semiconductor and/or doped polysilicon. It is appreciated that conductive layer 410 does not fully separate gate subregion 440 or gate subregion 415 from trench 130. Conductive layer 410 does separate region 420 from trench 130.

Conductive layer 410 provides a conductive path adjacent to trench 130 and reduces the overall resistance of gate structure 450. Conductive layer 410 encourages gate current flow through the "top" portion of gate subregion 415, e.g., a portion of subregion 415 adjacent to trench 130. Conductive layer 410 also tends to favor gate current flow toward the "upper" portions of the channel region, e.g., more toward channel portion N1 160 than toward channel portion N3 180.

Region 420 is heavily doped n++, e.g., from about $5.0E17$ cm$^{-3}$ to greater than $1.0E20$ cm$^{-3}$, in one embodiment. The region 420 is located adjacent to conductive layer 410 and adjacent to the edge of junction field effect transistor structure 400. Region 420 causes a beneficial reduction in gate current, e.g., by blocking a portion of gate subregion 415, gate subregion 440 and gate 450 from a source contact (not shown).

Gate subregion 415 will generally have a different doping level than that of gate subregion 440. However, the range of doping for gate subregion 415 is similar to the range of doing for gate subregion 440. For example, gate subregion 315 is highly doped, e.g., from about $5.0E17$ cm$^{-3}$ to greater than $1.0E20$ cm$^{-3}$, in one example. Gate subregion 415 enables the overall structure, gate 450, gate subregion 3440, gate subregion 415 and region 420, to maintain a low gate resistance. Further, gate subregion 415 serves to direct current toward the channel region.

Embodiments in accordance with the present invention, multiple doped channel in a multiple doped gate junction field effect transistor, are thus described. While the present invention has been described in particular embodiments, it should be appreciated that the present invention should not be construed as limited by such embodiments, but rather construed according to the below claims.

What is claimed is:

1. A junction field effect transistor (JFET) circuit structure comprising a vertical channel wherein said vertical channel comprises multiple doping regions, wherein said multiple doping regions of said vertical channel comprise a first region for enhancement mode operation and a second region for depletion mode operation.

2. The junction field effect transistor (JFET) circuit structure of claim 1 wherein said multiple doping regions of said vertical channel comprise at least three doping regions.

3. The junction field effect transistor (JFET) circuit structure of claim 1 wherein said multiple doping regions comprise doping in the range of about 1.0E14 per cubic centimeter to over about 1.0E17 per cubic centimeter.

4. The junction field effect transistor (JFET) circuit structure of claim 1 characterized as having improved current conductance in comparison to a similar JFET comprising a uniform channel doping.

5. The junction field effect transistor (JFET) circuit structure of claim 1 characterized as operable in enhancement mode from zero volts to about 600 volts.

6. The junction field effect transistor (JFET) circuit structure of claim 1 characterized as having a substantially constant threshold voltage from zero degrees Celsius to about 150 degrees Celsius.

7. A junction field effect transistor (JFET) circuit structure comprising:
a vertical channel;
a trench, having an inner wall adjacent to a portion of said vertical channel; and
a gate structure disposed substantially adjacent to a bottom wall of said trench and comprising multiple doping regions, wherein said multiple doping regions comprise at least two doping regions of opposite carrier types.

8. The junction field effect transistor (JFET) circuit structure of claim 7 wherein said multiple doping regions of said gate structure comprise a first doping region overlapping a portion of said inner wall, and a second doping region that does not fully overlap said bottom wall of said trench.

9. A junction field effect transistor (JFET) circuit structure comprising:
a vertical channel;
a trench, having an inner wall adjacent to a portion of said vertical channel; and
a gate structure disposed substantially adjacent to a bottom wall of said trench and comprising multiple doping regions, wherein said multiple doping regions of said gate structure comprise a first doping region overlapping a portion of said inner wall, and a second region that does not fully overlap said bottom wall of said trench, wherein said first doping region is fully depleted.

10. The junction field effect transistor (JFET) circuit structure of claim 8 wherein said first doping region comprises doping in the range of about 1.0B14 per cubic centimeter to about 5.0E17 per cubic centimeter.

11. The junction field effect transistor (JFET) circuit structure of claim 8 wherein said second doping region comprises doping in the range of about 1.0E17 per cubic centimeter to over about 5.0E20 per cubic centimeter.

12. The junction field effect transistor (JFET) circuit structure of claim 8 further comprising a third doping region fully contained within said second doping region, wherein said third doping region does not isolate said second doping region from said trench.

13. The junction field effect transistor (JFET) circuit structure of claim 12 further comprising a fourth doping region adjacent to said third doping region on a side away from said vertical channel, wherein said fourth doping region is of opposite carrier type of said third doping region.

14. The junction field effect transistor (JFET) circuit structure of claim 8 further comprising a conductive layer disposed adjacent to said bottom wall of said trench, wherein a portion of said second doping region remains adjacent to said trench.

15. The junction field effect transistor (JFET) circuit structure of claim 8 further comprising:
a third doping region fully contained within said second doping region, wherein said third doping region does not isolate said second doping region from said trench;
a fourth doping region adjacent to said third doping region on a side away from said vertical channel, wherein said fourth doping region is of opposite carrier type of said third doping region; and a conductive layer disposed adjacent to said bottom wall of said trench, wherein a portion of said second and said third doping regions remain adjacent to said trench.

16. A junction field effect transistor (JFET) circuit structure comprising:

a vertical channel comprising multiple doping regions;

a trench, having an inner wall adjacent to a portion of said vertical channel; and a gate structure disposed substantially adjacent to a bottom wall of said trench and comprising multiple doping regions.

17. The junction field effect transistor (JFET) circuit structure of claim 16 wherein at least one of said multiple doping regions of said gate structure is operable as a fully depleted region.

18. The junction field effect transistor (JFET) circuit structure of claim 16 wherein said vertical channel comprises a first region for enhancement mode operation and a second region for depletion mode operation.

19. The junction field effect transistor (JFET) circuit structure of claim 16 characterized as having a substantially constant threshold voltage from zero degrees Celsius to about 150 degrees Celsius.

* * * * *

UNITED STATES PATENT AND TRADEMARK OFFICE
CERTIFICATE OF CORRECTION

PATENT NO. : 7,211,845 B1  Page 1 of 1
APPLICATION NO. : 11/110507
DATED : May 1, 2007
INVENTOR(S) : Yu et al.

It is certified that error appears in the above-identified patent and that said Letters Patent is hereby corrected as shown below:

Column 6, line 37, please delete "1.0B14" and insert --1.0E14--.

Signed and Sealed this

Twenty-sixth Day of June, 2007

JON W. DUDAS
*Director of the United States Patent and Trademark Office*